(12) United States Patent
Hashizume et al.

(10) Patent No.: US 7,064,411 B2
(45) Date of Patent: Jun. 20, 2006

(54) SPIRAL INDUCTOR AND TRANSFORMER

(75) Inventors: Yasushi Hashizume, Tokyo (JP);
Kazuyasu Nishikawa, Tokyo (JP)

(73) Assignee: Mitsubishi Denki kabushiki Kaisha, Tokyo (JP)

( * ) Notice: Subject to any disclaimer, the term of this patent is extended or adjusted under 35 U.S.C. 154(b) by 0 days.

(21) Appl. No.: 10/501,883

(22) PCT Filed: Feb. 4, 2003

(86) PCT No.: PCT/JP03/01138

§ 371 (c)(1),
(2), (4) Date: Jul. 20, 2004

(87) PCT Pub. No.: WO2004/070746

PCT Pub. Date: Aug. 19, 2004

(65) Prior Publication Data

US 2005/0073025 A1    Apr. 7, 2005

(51) Int. Cl.
*H01L 29/00* (2006.01)
*H03H 7/01* (2006.01)

(52) U.S. Cl. .................. 257/531; 257/516; 333/185

(58) Field of Classification Search ............... 257/531, 257/516
See application file for complete search history.

(56) References Cited

U.S. PATENT DOCUMENTS 6,002,161 A    12/1999    Yamazaki
6,452,249 B1    9/2002    Maeda et al.
2003/0127686 A1*    7/2003    Lowther et al. ............ 257/331

FOREIGN PATENT DOCUMENTS

JP    2001-284125    10/2001

OTHER PUBLICATIONS

Joachim N. Burghartz, et al. "Microwave Inductors and Capacitors in Standard Multilevel Interconnect Silicon Technology", IEEE Transactions on Microwave Theory and Techniques, vol. 44, No. 1, Jan. 1996, pp. 100-104.

* cited by examiner

*Primary Examiner*—Thomas L. Dickey
(74) *Attorney, Agent, or Firm*—Leydig, Voit & Mayer, Ltd.

(57) ABSTRACT

A spiral inductor in which, where a spiral interconnect and an underpass interconnect intersect with each other, at least one layer of an electrically conductive film that forms the spiral interconnect is the underpass interconnect. The spiral interconnect has a smaller number of electrically conductive layers in the intersecting portion and has a wider interconnect width than the spiral interconnect in a non-intersecting portion.

2 Claims, 13 Drawing Sheets

SPIRAL INDUCTOR AND TRANSFORMER

TECHNICAL FIELD

The present invention relates to a spiral inductor and a transformer.

BACKGROUND ART

For a portable terminal or personal digital assistant (PDA) such as a cellular phone, a more compact and more high-performance device is required. For this reason, there has been a concentrated effort to reduce the size of and to enhance the performance of a device such as a high-frequency device, incorporated in a PDA.

In portable terminals and wireless LANs (Local Area Networks), a GHz band is mainly used as a carrier frequency. Conventionally, a semiconductor device, which is used for analog circuits for GHz-frequency-band-using transceiver, has been formed on a gallium arsenide substrate. However, the microfabrication technology of a silicon CMOS (Complementary Metal Oxide Semiconductor) has advanced, and the operational frequency on a silicon substrate goes high, thereby enabling a semiconductor device operated in a GHz frequency to be fabricated by use of a silicon substrate. The device can be fabricated at a lower production cost on the silicon substrate than on the gallium arsenide substrate. Moreover, when a silicon substrate is used, a digital circuit that has been fabricated on a silicon substrate and an analog circuit for transmission and reception can be advantageously fabricated on a single substrate.

Important passive elements used for the analog circuit include a spiral inductor. The spiral inductor is several tens to several hundreds of micrometers in diameter, and occupies an extremely large area as compared with an active element such as a transistor. Therefore, in order to reduce the size of a semiconductor device provided with an analog circuit, if the size of the spiral inductor can be reduced, it is very effective.

A conventional typical spiral inductor is composed of a spiral interconnection formed of an electroconductive film layer wired and disposed in a spiral shape, an underpass interconnect, which is led out to outside from the internal end of this spiral interconnect, and a plug interconnect, which electrically connects the spiral and underpass interconnects.

The spiral inductor is formed on an insulating film provided over the semiconductor substrate. For the electroconductive film layer, on a gallium arsenide substrate, for example, gold or gold alloy is used, and on a silicon substrate, for example, aluminum, aluminum alloy, or copper is used.

As described above, the microfabrication technique of the silicon CMOS enabled a silicon substrate to be used in the fabrication of a high frequency analog circuit that can be used in a GHz frequency band, thereby bringing forward the size reduction of a semiconductor device. However, in order to form fine patterns in a lateral direction in the semiconductor device, it is necessary to reduce the thickness of the electroconductive film layer used for the analog circuit. The thickness reduction of the electroconductive film layer can reduce the size of the spiral inductor; however, when the thickness of the film layer is reduced, the resistance of the spiral inductor increases, to thereby degrade the performance of the device.

For this reason, conventionally, as a practicable solution, the following method has been proposed.

For example, a conventional spiral inductor proposed by J. N. Burghartz, et al. (see "Microwave Inductors and Capacitors in Standard Multilevel Interconnect Silicon Technology," IEEE TRANSACTION ON MICROWAVE THEORY AND TECHNOLOGYS, VOL. 44, and pp.100–104, 1996) is fabricated by using four-layer electroconductive film layers made of an alloy of aluminum and copper. A silicon substrate is used for the semiconductor substrate, and a first to fourth electroconductive film layers are stacked on an insulating layer provided over the substrate, with insulating layers each disposed between the electroconductive film layers. A spiral interconnect is formed by connecting these electroconductive film layers in parallel by use of a plug interconnect.

Thus, two or more electroconductive film layers are connected in parallel to form the spiral interconnect, thereby reducing the resistance of the spiral interconnect and enhancing the performance of the spiral inductor.

In this conventional spiral inductor, an underpass interconnect is formed by use of the first electroconductive film layer, and is electrically connected with the spiral interconnect via the plug interconnect.

Moreover, for example, in a conventional spiral inductor disclosed in JP-A-9-181264, a spiral interconnect is formed by use of a second electroconductive film layer, and an underpass interconnect is formed by use of a first electroconductive film layer located under the second electroconductive film layer. In addition, the area within the first electroconductive film layer, which is other than the area where the above underpass interconnect is formed, is used to form another spiral interconnect, and the obtained spiral interconnect is connected with the above spiral interconnect formed of the second electroconductive film layer in parallel.

Thus, in this conventional spiral inductor, of the spiral interconnect, in the portion where a plurality of electroconductive film layers are connected in parallel with each other, the thickness of the electroconductive film layer has been substantially increased, which can reduce the resistance of the portion.

However, in these conventional spiral inductors, because the underpass interconnect, and the spiral interconnect in the area where the spiral interconnect intersects the underpass interconnect in the above-mentioned second conventional example are formed with a small number of thin electroconductive film layers, the resistance of the portion cannot be reduced.

In addition, there arise the following problems when large electric current is passed through the spiral inductor.

When the spiral inductor is used for a circuit through which large current flows such as the transmitter circuit of radio communication, how to prevent the occurrence of an electromigration (breakage of the wiring) is a more important subject than how to enhance the performance of the spiral inductor. The electromigration is caused by the generation of defects, caused by the migration of metal atoms in the interconnect, which is caused by the electron flowing through the interconnect.

For the conventional spiral inductors mentioned above, in the portion that is formed with a small number of electroconductive film layers, the electromigration is easily caused. To be more specific, the underpass interconnect in the above spiral inductor described by J. N. Burghartz et al., and the underpass interconnect and the portion of the spiral interconnect, in which the spiral interconnect intersects this underpass interconnect, in the spiral inductor disclosed in JP-A-9-181264 are formed with a small number of electroconductive Film layers. Therefore, even if the spiral interconnect portion is formed with two or more electroconductive film layers, only the current, which can pass the underpass interconnect portion formed with one layer, can be passed through this spiral interconnect portion by reason of reliability.

In order to prevent the occurrence of the electromigration in these conventional spiral inductors, the following methods are assumed.

One method is to increase the width of the underpass interconnect, to thereby increase the resistance of the underpass interconnect portion to the electromigration. However, when the width of the underpass interconnect, which is close to the semiconductor substrate, is increased, the wider the width of the interconnect is, the larger the parasitic capacitance between the underpass interconnect and the semiconductor substrate becomes, which may lead to deteriorate the performance of the spiral inductor. Because the opposed area between the spiral interconnect and the underpass interconnect is also increased, the parasitic capacitance existing therebetween increases. This also can become a factor to degrade the performance of the spiral inductor.

Another method is to form the underpass interconnect by connecting in parallel the two electroconductive film layers, which are closest to the semiconductor substrate, and to form the spiral interconnect by use of only the top electroconductive film layer. According to this method, the underpass interconnect is composed of the two layers, which may enhance the resistance thereof to the electromigration. Further, this method can suppress an increase in the parasitic capacitance existing around the underpass interconnect as compared with the above-mentioned method. However, in order to obtain the same inductance as that obtained when the spiral interconnect is formed with two layers, it is necessary to increase the width of the interconnect, and to simultaneously increase the diameter of the spiral inductor. This requires a corresponding large area.

Thus, in order to prevent the electromigration in the conventional spiral inductors, the parasitic capacitance may increase to degrade the performance thereof or increase the area of the spiral inductor. In other words, there remains a problem that it is necessary to sacrifice either of the performance or the area.

The present invention has been accomplished to solve the above-mentioned problem, and an object of the present invention is to provide a spiral inductor such that the occurrence of the electromigration can be prevented while the performance thereof is maintained and small-sized.

DISCLOSURE OF THE INVENTION

The spiral inductor according to the present invention is a spiral inductor formed with n levels ($n \geq 2$) of electroconductive film layers disposed on a semiconductor substrate with insulators inserted therebetween, and includes: a spiral interconnect formed by disposing spirally the i-layer ($2 \leq i \leq n$) electroconductive film layers electrically connected and vertically adjacent to each other; and an underpass interconnect that is formed with the k-layer ($1 \leq k \leq n-1$) electroconductive film layers electrically connected and vertically adjacent to each other, and that is electrically connected with the internal end of the spiral interconnect, wherein in the portion where the spiral interconnect and the underpass interconnect intersect each other, the j ($1 \leq j < i$) layers vertically adjacent to each other are used as the electroconductive film layers forming the underpass interconnect of the electroconductive film layers forming the spiral interconnect, and in the portion of the spiral interconnect intersecting with the underpass interconnect, the narrowest part is wider than the narrowest part in the portion of the spiral interconnect not intersecting with the underpass interconnect.

In such a way, the electromigration is suppressed by this, further the performance of the spiral inductor is not deteriorated, and a small-sized spiral inductor can be obtained.

BEST MODE OF CARRYING OUT THE INVENTION

Hereinafter, the best mode for carrying out the present invention will be described with reference to the figures in order to make description in further detail of the present invention.

FIRST EMBODIMENT

Figure 1:
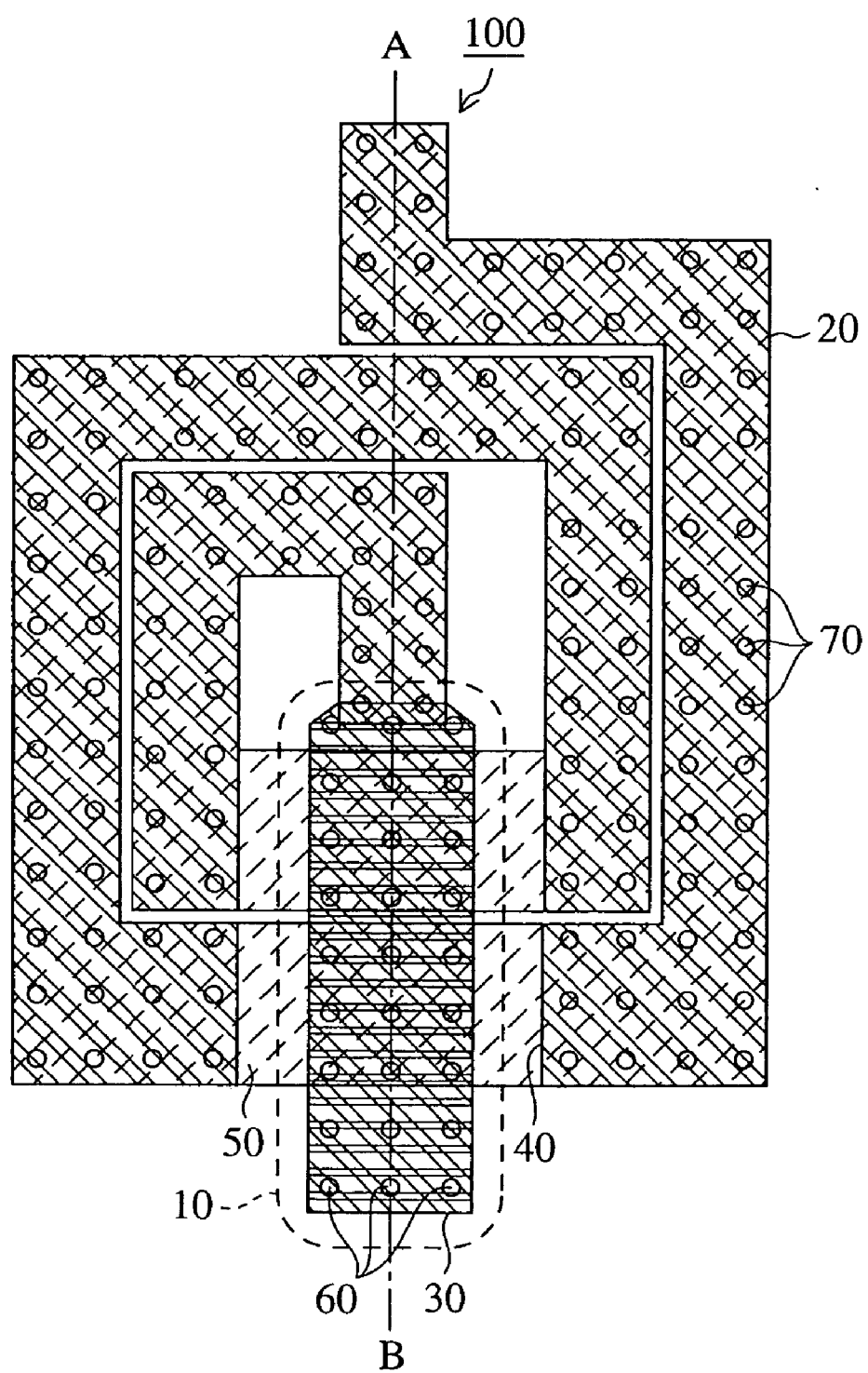
FIG. 1 is a schematic diagram of a spiral inductor in accordance with a first embodiment of the present invention as seen from the top thereof.
Figure 3:
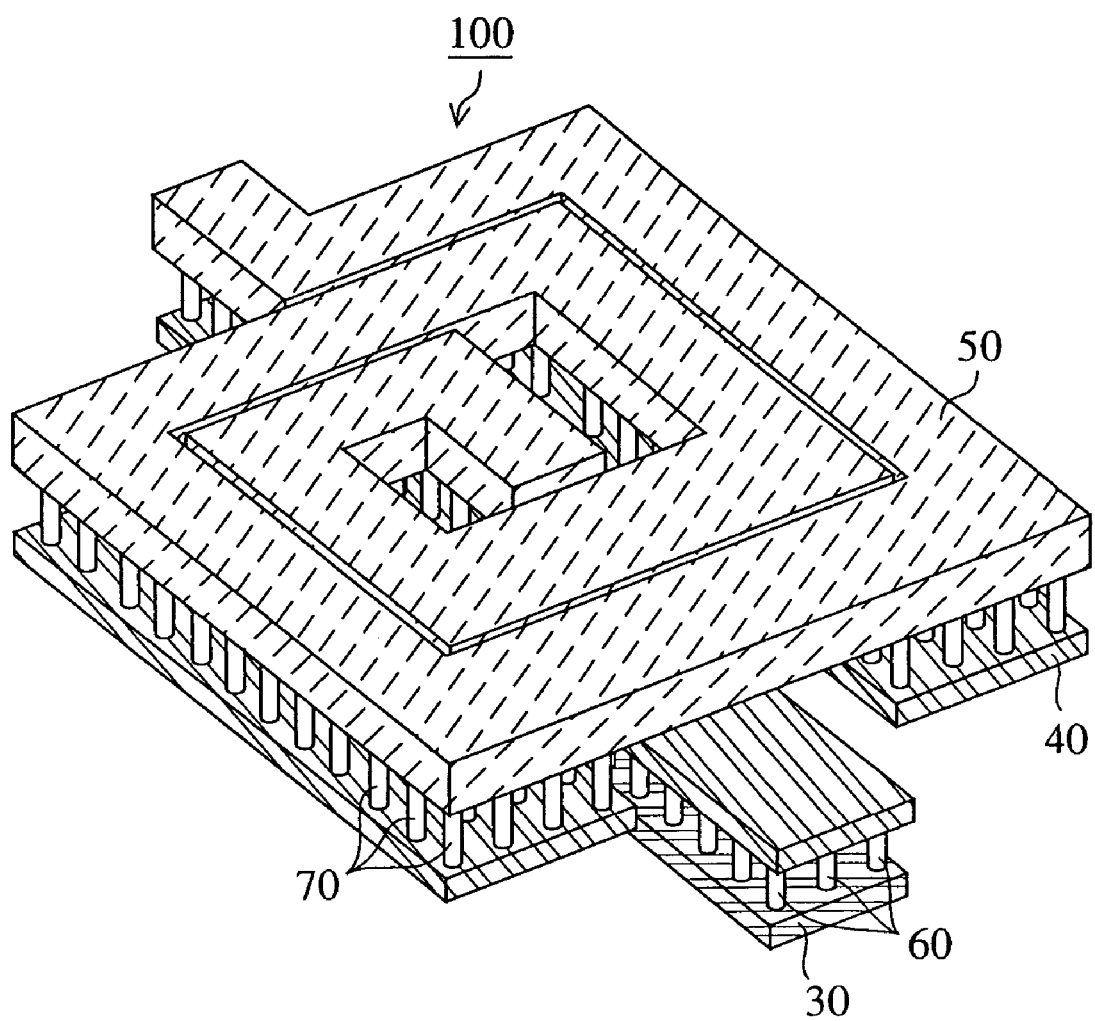
FIG. 3 is a perspective view of the spiral inductor in accordance with the first embodiment of the present invention.
Figure 4:
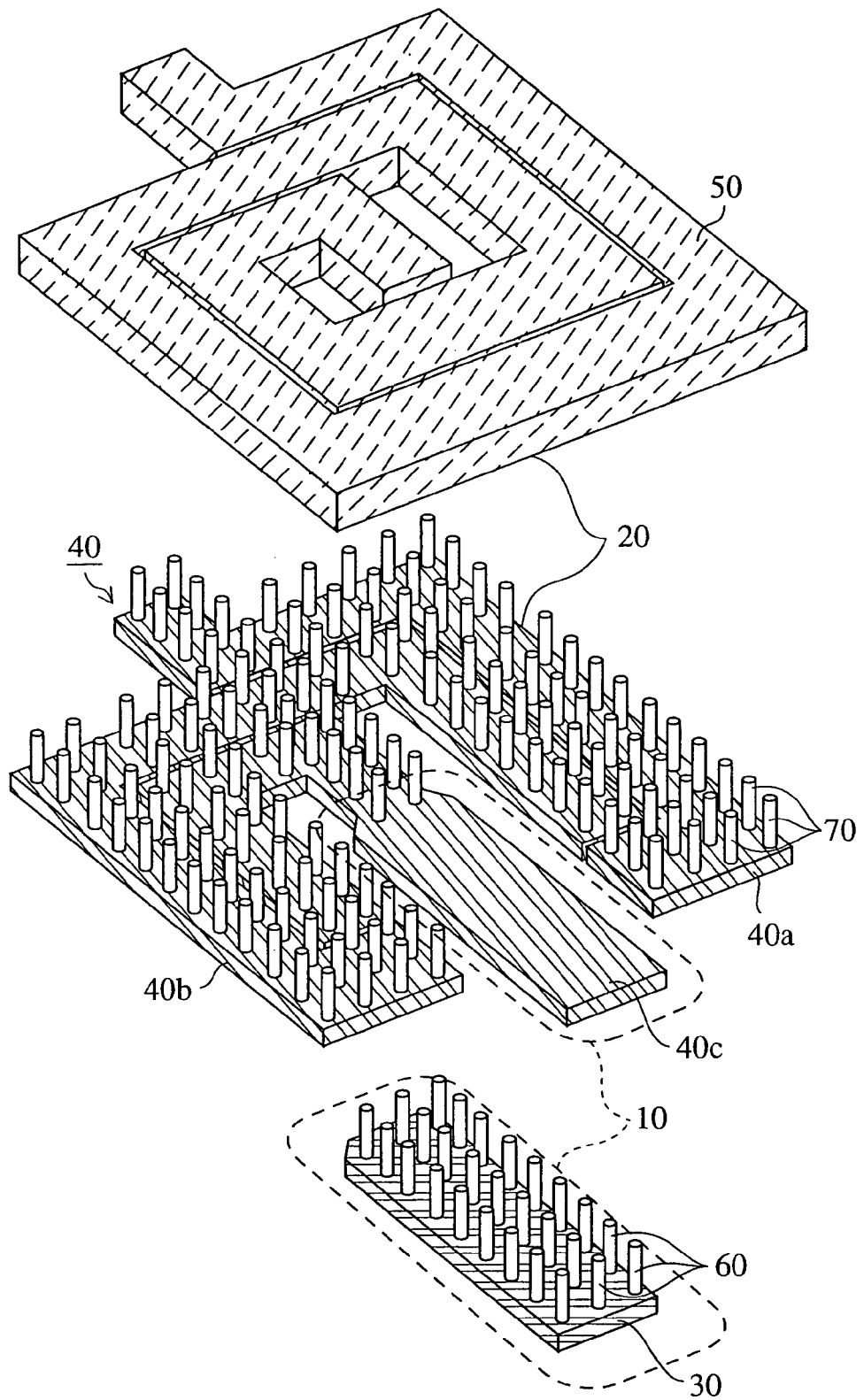
FIG. 4 is an exploded perspective view of the spiral inductor in accordance with the first embodiment of the present invention.

FIG. 1 is a schematic diagram of a spiral inductor 100 in accordance with a first embodiment of the present invention as seen from the top thereof. FIG. 3 is a perspective view of the spiral inductor 100. FIG. 4 is a perspective view, which shows the state where the spiral inductor 100 is vertically divided so as to explain the positional relationship between the wirings thereof. Further, FIG. 5 is a sectional view of the spiral inductor 100, taken along the line A-B in FIG. 1.

Figure 5:
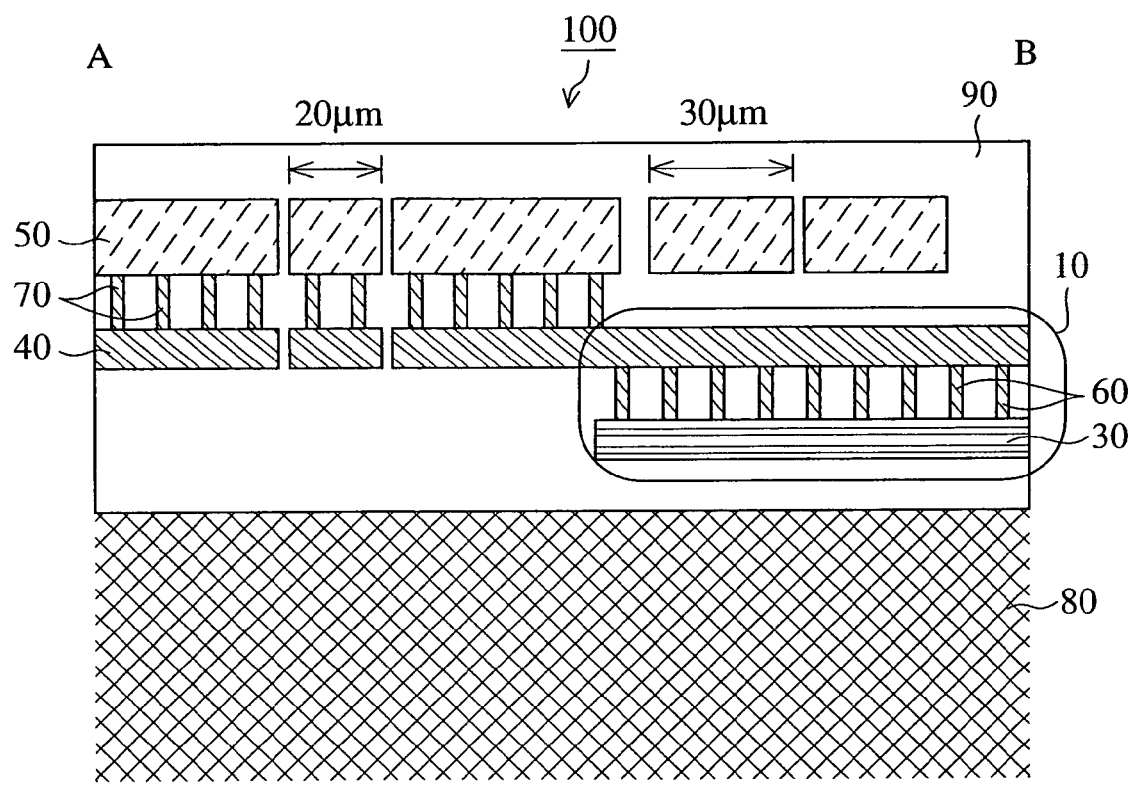
FIG. 5 is a sectional view of the spiral inductor in the direction of A-B in FIG. 1.

As shown in FIG. 3, FIG. 4, and FIG. 5, the spiral inductor 100 has electroconductive film layers each of which forms a first metal interconnect 30, a second metal interconnect 40, and a third metal interconnect 50 on a semiconductor substrate 80. An insulator 90 having a thickness of, for example, 1 μm is provided between the electroconductive film layers. As shown in FIG. 4, the second metal interconnect 40 is composed of metal pieces 40a, 40b, and 40c.

Moreover, as shown in FIG. 4, the spiral inductor 100 includes an underpass interconnect 10 and a spiral interconnect 20.

As shown in FIG. 4, the underpass interconnect 10 connects the first metal interconnect 30 with the metal piece 40c in parallel by use of a lot of first contact plugs 60.

As shown in FIG. 4, the spiral interconnect 20 is composed of only the third metal interconnect 50 in the places where the underpass interconnect 10 exists right under the spiral interconnect. However, the spiral interconnect 20 connects the third metal interconnect 50 and the second metal interconnect 40 in parallel by use of second contact plugs 70 in the places where the underpass interconnect 10 does not exist right under the spiral interconnect.

Figure 2:
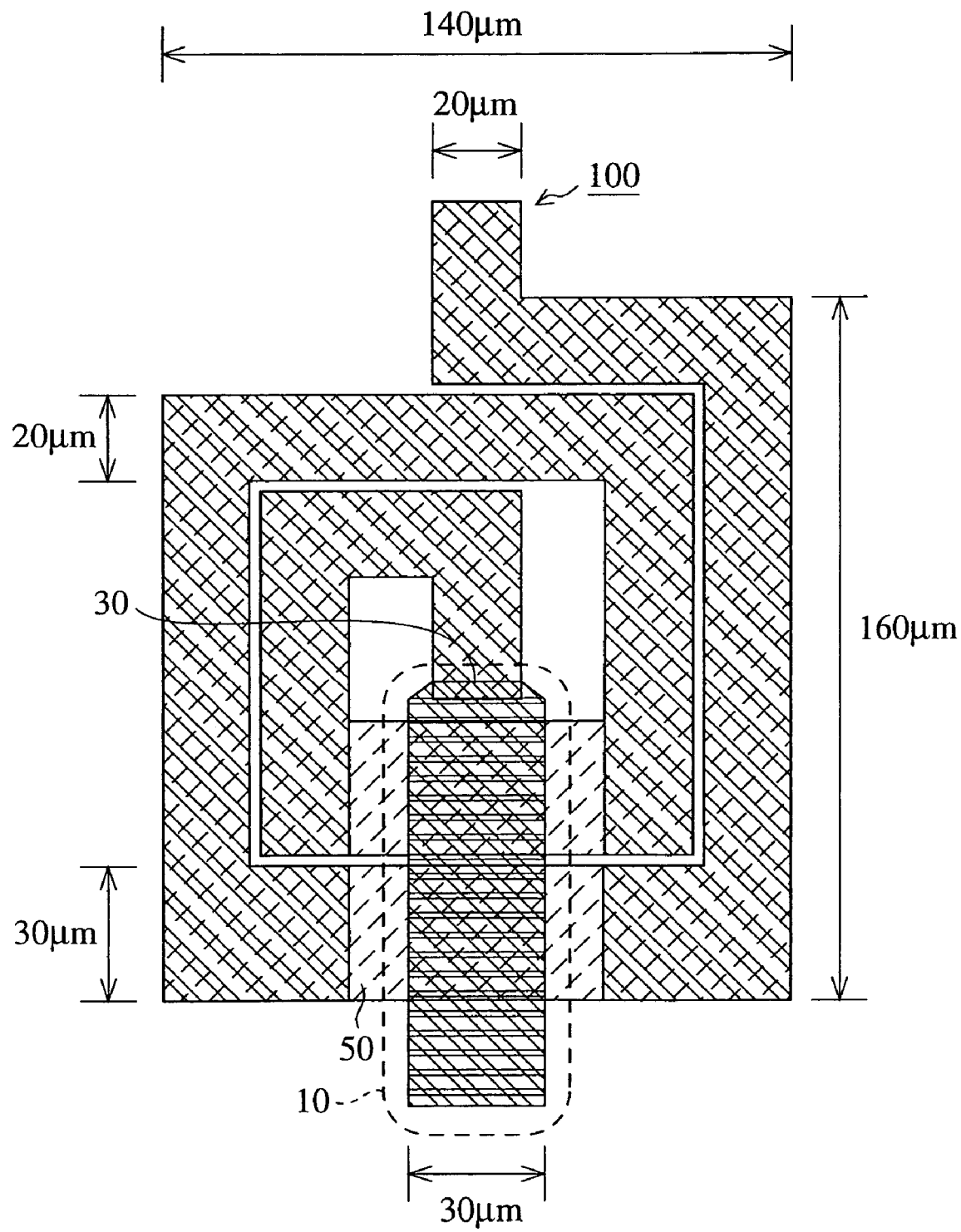
FIG. 2 is a view showing dimensions of wirings of the spiral inductor in accordance with the first embodiment of the present invention.

FIG. 2 is a view showing dimensions of the spiral inductor 100. As shown in the figure, the width of the third metal interconnect 50 that forms the spiral interconnect 20 is, for example, 20 μm in the straight line portions where the underpass interconnect 10 does not exist right under the spiral interconnect. Meanwhile, in the straight line portions where the underpass interconnect 10 exists right under the spiral interconnect, the width is broadened to, for example, 30 μm.

Moreover, for the second metal interconnect 40, the width of the portion which forms the spiral interconnect 20 (the metal interconnects 40b, 40c) is 20 μm, and the width of the portion that forms the underpass interconnect 10 (the metal interconnect 40a) is 30 μm. The width of the first metal interconnect 30 that forms the underpass interconnect 10 is set to 30 μm.

Thus, for the spiral interconnect 20, the portion where the third metal interconnect 50 and the second metal interconnect 40 are connected in parallel is arranged so as to have a narrow width (20 μm), and the portion, which is formed with only the third metal interconnect 50, is arranged so as to have a wide width (30 μm). Moreover, the width of the underpass interconnect 10 formed with the first metal interconnect 30 and the second metal interconnect 40 is set to 30 μm.

Thus widening the width of the portion, which is formed with a small number of layers, enables to prevent an occurrence of electromigration in any portion of the spiral inductor 100. Further, this structure can prevent the problem of an increase in parasitic capacitance which may be caused by an over-broadening width of the underpass interconnect 10. In addition, this structure can reduce the area occupied by the spiral inductor 100.

It is essential only that the width of each of the interconnects is determined so as to be the width of the lower limit in which the electromigration does not occur, from the viewpoint of making the spiral inductor 100 small-sized.

In the first embodiment, as shown in FIG. 5, the spiral inductor 100 is enclosed by the insulator 90; however, the spiral inductor can have, for example, a layered structure of a plurality of insulators if the above structure composed of the metal interconnects is supported and the metal interconnects are insulated by the layered structure. Moreover, the spiral inductor 100 can be partially hollow, and can be of structure containing an electric conductor, which is insulated from the spiral inductor.

Further, the metal interconnects and the contact interconnects can be formed of different materials, and can be also simultaneously formed with the same material similarly as in a damascene structure where, for example, copper is used.

In addition, in the first embodiment, the contact interconnects are prepared by cylindrical electric conductors; however, the contact interconnects may have any other shapes if the contact interconnects can electrically connect the upper and lower interconnects. The contact interconnects can be, for example, a plate-shaped contact interconnect to be formed by burying a certain electric conductor in a recess or groove provided along the direction of interconnect of the spiral interconnect.

Moreover, the width of each of the interconnects can be determined by comprehensively adjusting the thicknesses of the electroconductive film layers that form the first to third metal interconnects. For example, if the thickness of the top electroconductive film layer (the third metal interconnect 50) is increased, the width thereof can be reduced.

Additionally, in the first embodiment, a silicon substrate is employed as the semiconductor substrate; however, for example, a SiGe substrate, a stacked substrate of plural types of semiconductors, or a substrate such as an SOI (Silicon On Insulator) inserting an insulator therebetween maybe employed.

As mentioned above, according to the first embodiment, in the spiral inductor 100 including three electroconductive film layers, in the places where the underpass interconnect 10 exists right under the spiral interconnect, the wiring width of the spiral interconnect is broadened instead of the spiral interconnect 20 formed with one electroconductive film layer, while in the places where the underpass interconnect 10 does not exist right under the spiral interconnect, the wiring width of the spiral interconnect is narrowed instead of the spiral interconnect 20 formed with two electroconductive film layers. As a result, the electromigration can be suppressed in every portion of the spiral inductor 100, further the performance of the spiral inductor 100 is not deteriorated, and an increase in the area can be suppressed.

Further, the spiral inductor 100 is not limited to the spiral inductor including three-layer electroconductive film layers, and the inductor can include two-or-more layer electroconductive film layers. Even when the spiral inductor includes three-or-more electroconductive film layers, it is not necessary that all of the electroconductive film layers be used for the spiral interconnect, but it is essential only that two or more electroconductive film layers be arbitrarily used to form the spiral interconnect. At that time, preferably the spiral inductor is fabricated by using the electroconductive film layers, which are located in the upper layers apart from the semiconductor substrate. This enables the parasitic capacitance between the semiconductor substrate and the spiral inductor to be reduced, resulting in a spiral inductor having higher performance.

SECOND EMBODIMENT

The external shape of the spiral inductor is not limited to a rectangular shape shown in the first embodiment, but the shape can be pentagonal or more polygonal. Moreover, the direction of the two terminals of the spiral inductor is not limited to 180 degree as shown in the first embodiment.

Figure 6:
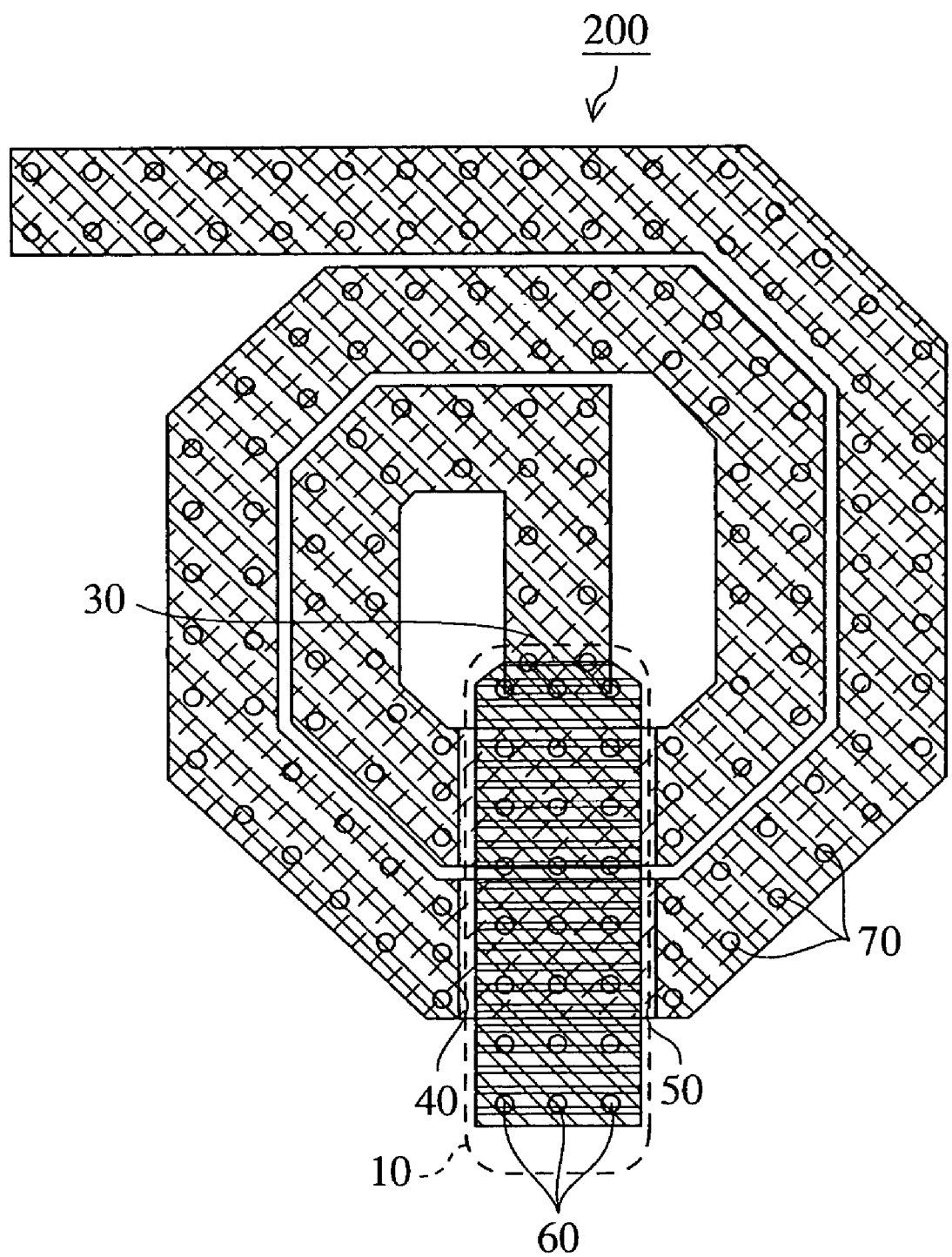
FIG. 6 is a schematic diagram of a spiral inductor in accordance with a second embodiment of the present invention as seen from the top thereof.
Figure 7:
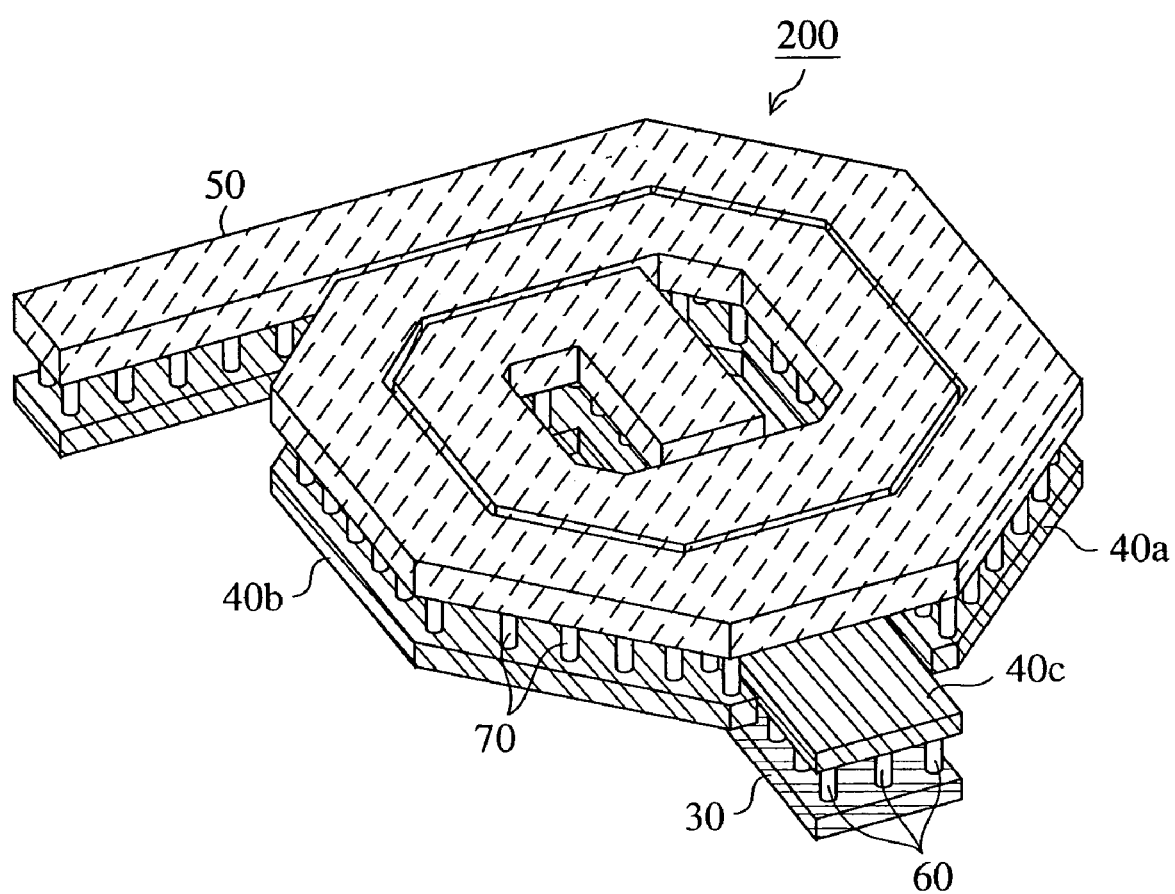
FIG. 7 is a perspective view of the spiral inductor in accordance with the second embodiment of the present invention.

For example, as in the spiral inductor 200 shown in FIG. 6 and FIG. 7, the terminals may be led out in the direction of 90 degree in the octagonal-shaped inductor. For the reference numerals used in the figures, the same numerals as that in FIG. 1 and FIG. 3 designate the same constituent elements.

As shown in the figures, in the straight line portions (one side of the octagon) placing the underpass interconnect 10 right under, the width of the interconnect is widened more than the width thereof in the straight line portions not placing the underpass interconnect 10 right under.

Thus, regardless of the external shape of the spiral inductor and the directions of the terminals thereof, the effect similar to that of the first embodiment may be obtained.

THIRD EMBODIMENT

Figure 8:
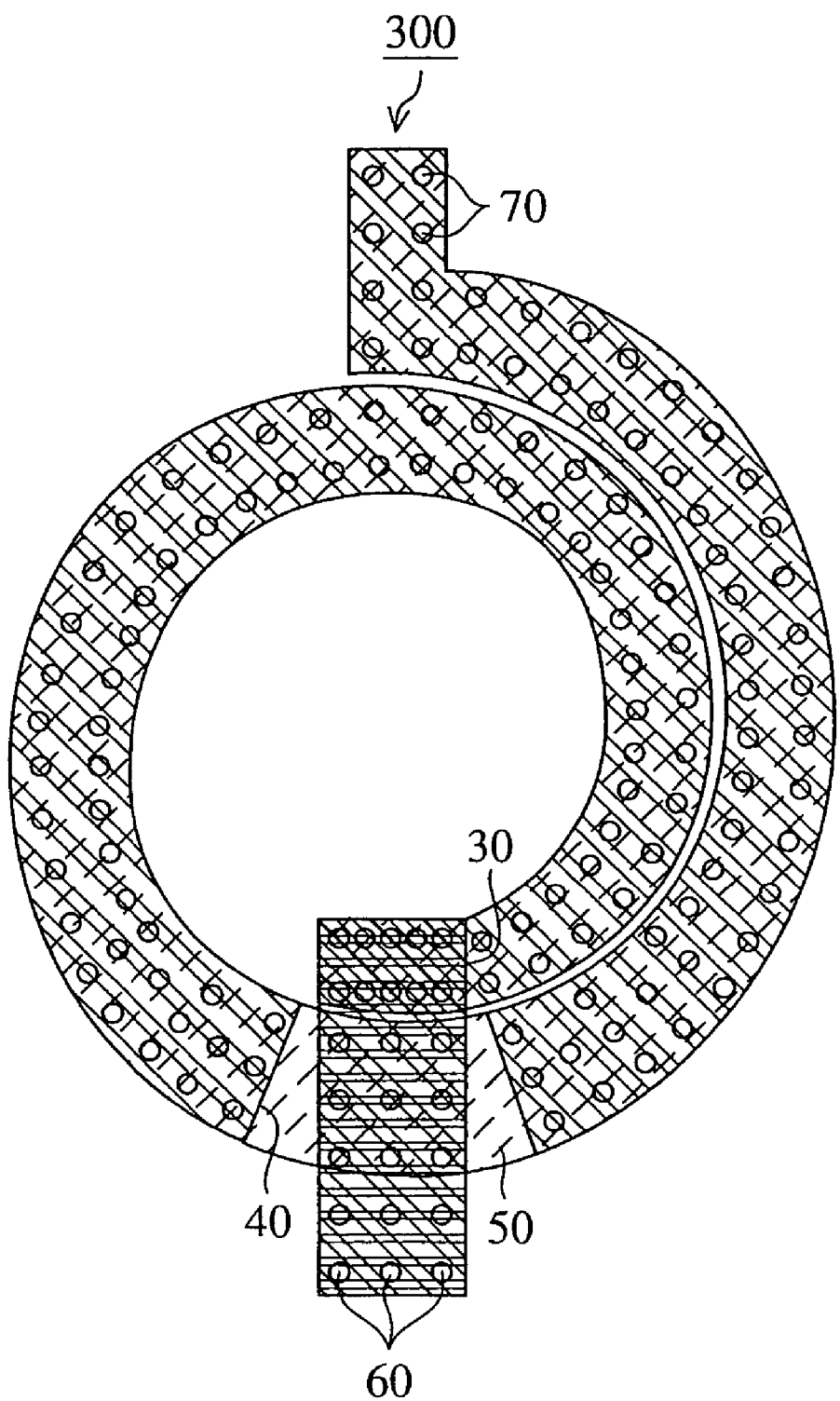
FIG. 8 is a schematic diagram of a spiral inductor in accordance with a third embodiment of the present invention as seen from the top thereof.
Figure 9:
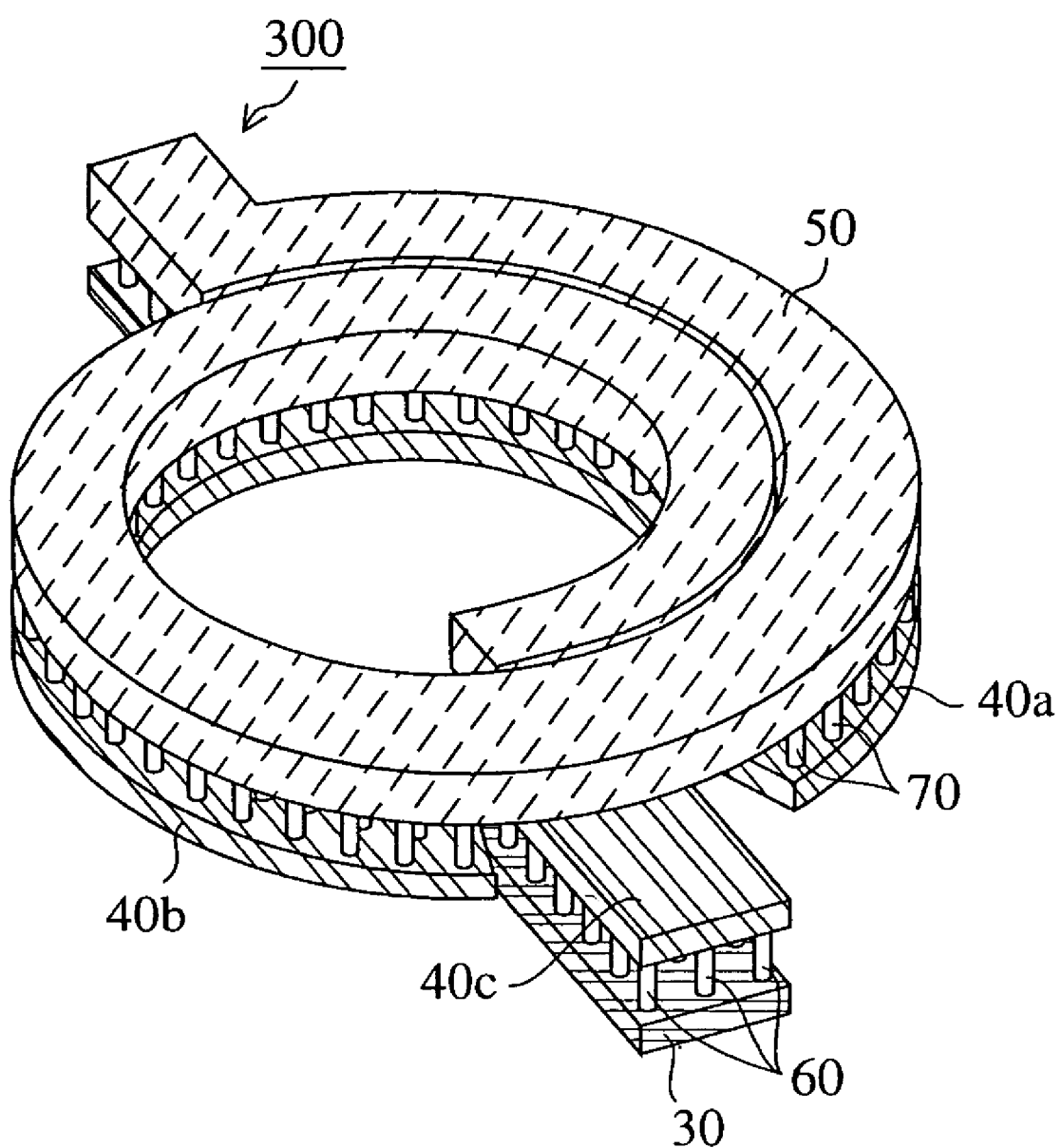
FIG. 9 is a perspective view of the spiral inductor in accordance with the third embodiment of the present invention.

In addition, the external shape of the spiral inductor may be curved as in the spiral inductor 300 shown in FIG. 8 and FIG. 9. For the reference numerals in the figures, the same numerals as that in FIG. 1 and FIG. 3 designate the same constituent elements.

As shown in FIG. 8, in the portion in which the spiral interconnect 20 is formed by connecting the second metal interconnect 40 and the third metal interconnect 50 by use of the second contact interconnect 70, the width of the interconnect in the upper half of the figure is narrowed. In the portion where the spiral interconnect 20 is formed with only the second metal interconnect 40, the spiral interconnect is formed so as to have the regularly wide width.

The portions each having a different interconnect width each other are preferably connected to each other by gradually changing the interconnect widths thereof as shown in FIG. 8 and FIG. 9.

The resistance to the electromigration of the spiral inductor 300 is determined by the resistance in the narrowest portion in each portion (the first layer portion and the second layer portion) of the spiral interconnect.

Thus, even when the external shape of the spiral inductor is curved, the similar effect to that of the first embodiment can be obtained.

FOURTH EMBODIMENT

The spiral inductors in the first to third embodiments all have two terminals; however, the spiral inductor can have one or more leads led out from the midpoint of the spiral inductor.

Figure 10:
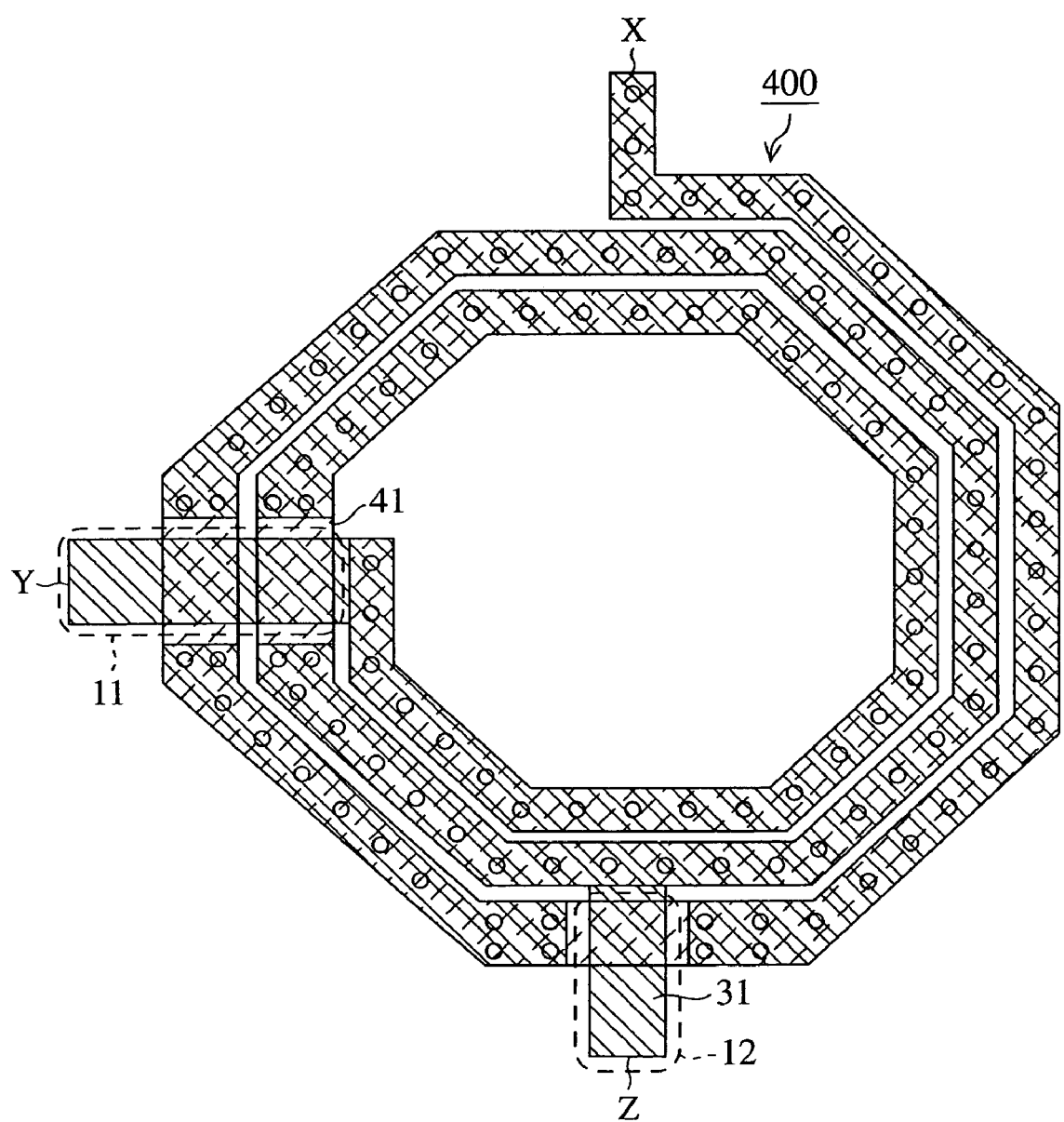
FIG. 10 is a schematic diagram of a spiral inductor in accordance with a fourth embodiment of the present invention as seen from the top thereof.
Figure 11:
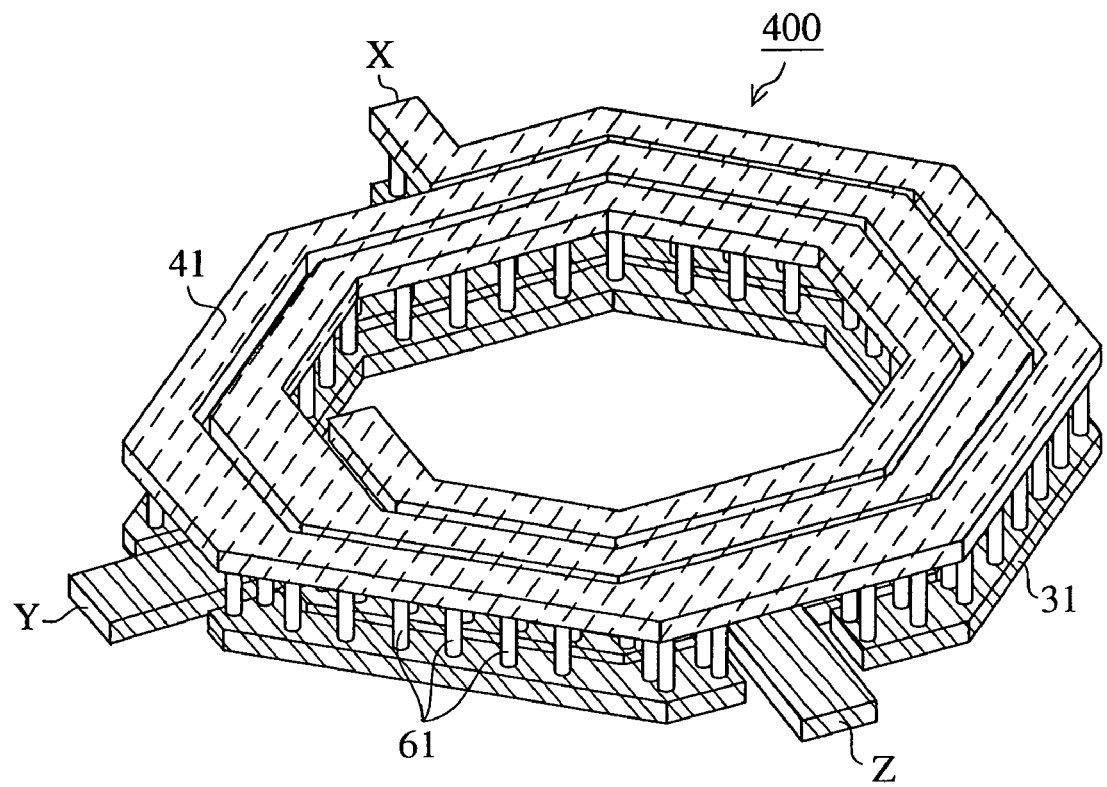
FIG. 11 is a perspective view of the spiral inductor in accordance with the fourth embodiment of the present invention.

FIG. 10 is a schematic diagram of a spiral inductor 400 in accordance with a fourth embodiment of the present invention as seen from the top thereof. FIG. 11 is a perspective view of the spiral inductor 400. The spiral inductor 400 includes two electroconductive film layers. The upper electroconductive film layer forms a second metal interconnect 41, and the lower electroconductive film layer forms a first metal interconnect 31.

Figure 12:
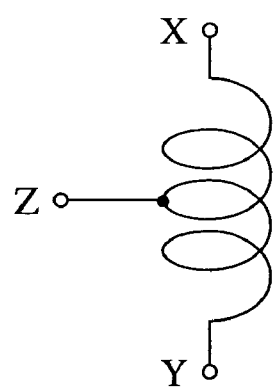
FIG. 12 is a simplified figure of the spiral inductor in accordance with the fourth embodiment of the present invention.

The spiral inductor 400 includes a first underpass interconnect 11 (terminal Y) and a second underpass interconnect 12 (terminal Z). The terminal Z is a lead led out from the midpoint of the spiral interconnect, and the terminal Y is a terminal, which is the internal end of the spiral interconnect. The spiral inductor 400 can be simplified as shown in FIG. 12.

The first underpass interconnect 11 and the second underpass interconnect 12 are formed with a part of a second metal interconnect 31.

Moreover, in the portions placing the first underpass interconnect 11 and the second underpass interconnect 12 right under, the spiral interconnect is formed with only the second metal interconnect 41. In the other portions, the spiral interconnect is formed by connecting the second metal interconnect 41 and the first metal interconnect 31 in parallel by use of a first contact interconnect 61.

The interconnect width of the spiral interconnect is wider in the straight line portions placing the first underpass interconnect 11 and the second underpass interconnect 12 right under than the interconnect width thereof in the straight line portions not placing the underpass interconnect right under.

Such a structure of the spiral interconnect can produce the effect similar to that of the first embodiment.

For the underpass interconnect that forms each of the terminals, it is preferable to individually design the interconnect width thereof so as to meet the amount of flowing current.

Moreover, it is preferable to arrange the terminals X, Y of both ends such that a larger amount of current flows through the terminal on the external side, which is formed by use of two-layer metal wirings, of the terminals X, Y. This can reduce the amount of current, which flows through the first underpass interconnect 11. As a result, an increase in the interconnect width of the first underpass interconnect 11 can be suppressed. Therefore, the parasitic capacitance between the first underpass interconnect 11 and the semiconductor substrate or between the first underpass interconnect 11 and the spiral interconnect located thereon can be reduced, thereby enabling the fabrication of a spiral inductor having higher performance.

FIFTH EMBODIMENT

In the first to fourth embodiments, in any case, a single spiral inductor is fabricated. However, even when two spiral inductors are combined to fabricate a transformer, a similar effect can be obtained by use of a similar structure.

Figure 13:
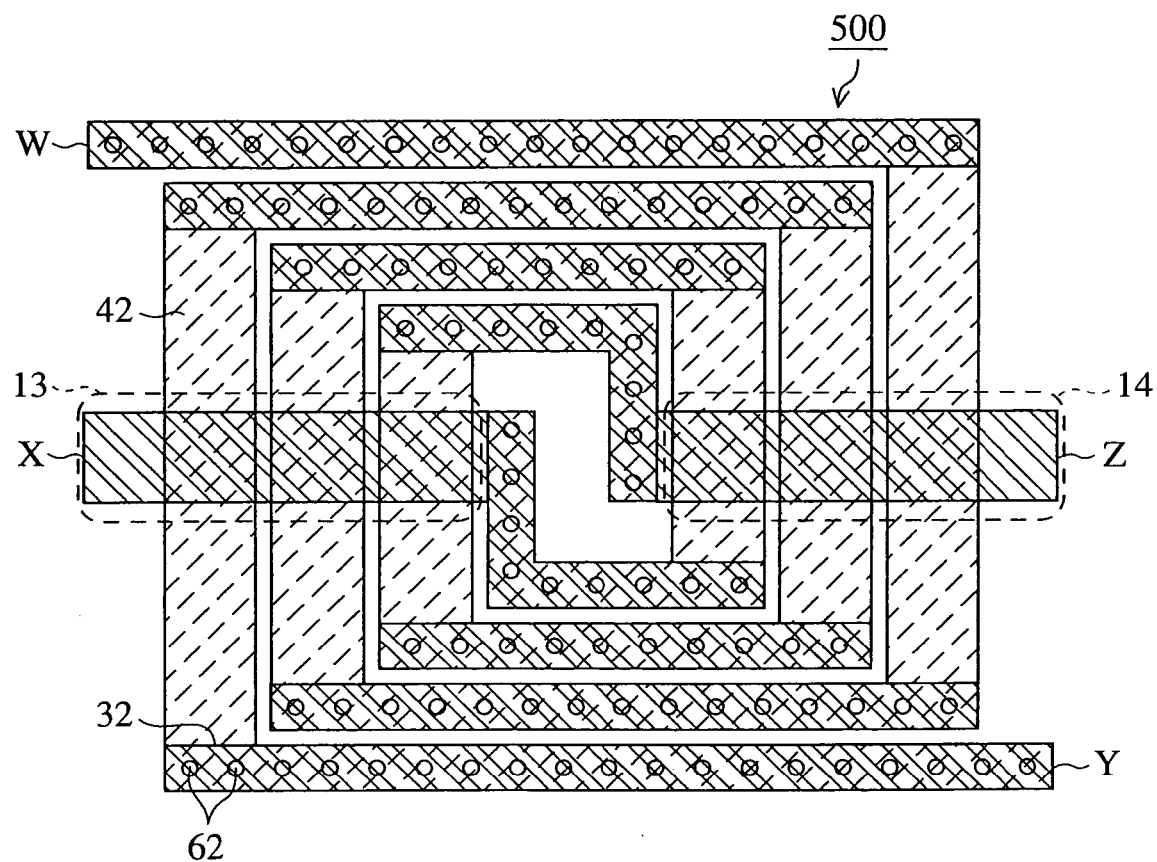
FIG. 13 is a schematic diagram of a transformer in accordance with a fifth embodiment of the present invention as seen from the top thereof.
Figure 14:
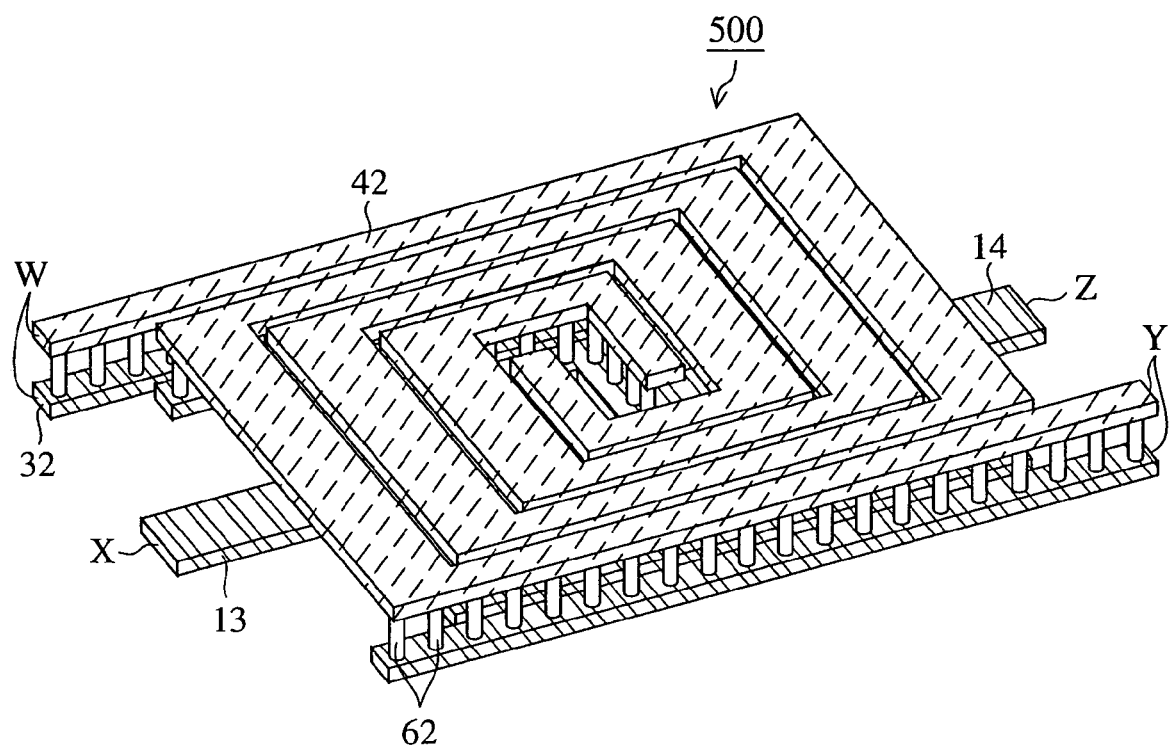
FIG. 14 is a perspective view of the transformer in accordance with the fifth embodiment of the present invention.

FIG. 13 is a schematic diagram of a transformer 500 according to a fifth embodiment of the present invention as seen from the top thereof. FIG. 14 is a perspective view of the transformer 500.

Figure 15:
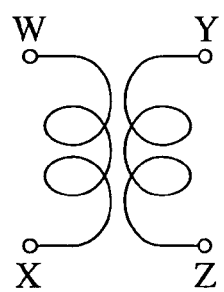
FIG. 15 is a simplified figure of the transformer in accordance with the fifth embodiment of the present invention.

In this transformer 500, a pair of a terminal W and a terminal X forms a spiral inductor, and another pair of a terminal Y and a terminal Z forms another spiral inductor. The transformer 500 can be simplified as shown in FIG. 15.

In addition, the transformer 500 includes two electroconductive film layers. The upper electroconductive film layer forms a second metal interconnect 42, and the lower electroconductive film layer forms a first metal interconnect 32.

A first underpass interconnect 13 (terminal X) and a second underpass interconnect 14 (terminal Z) are formed with a part of the first metal interconnect 32. Moreover, the spiral interconnect, in the portions right under which the first underpass interconnect 13 and the second underpass interconnect 14 exist, is formed with only the second metal interconnect 42. In other portions, the spiral interconnect is formed by connecting the second metal interconnect 42 and the first metal interconnect 32 in parallel by use of a first contact interconnect 62.

The interconnect width of the spiral interconnect is wider in the straight line portions (the interconnects in a vertical direction in the figure) right under which the first underpass interconnect 13 and the second under pass interconnect 14 exist than the interconnect width thereof in the straight line portions (the wirings in a horizontal direction in the figure) right under which no underpass interconnect exists.

Such a structure of the transformer 500 can also produce the effect similar to that of the first embodiment.

Additionally, when the spiral interconnect is built with straight interconnects, either of the following two types of structures can be selected; a structure in which only a part of the wide-width straight portions where the spiral interconnect intersects the underpass interconnect is formed with a small number of interconnect layers (for example, the first and fourth embodiments), and a structure in which the whole of the wide-width straight portions where the spiral interconnect intersects the underpass interconnect is formed with a small number of interconnect layers, like the structure in the fifth embodiment.

In each structure, the electromigration can be suppressed. Moreover, there is no difference in the area occupied by the spiral inductor therebetween. However, in the former, the parasitic resistance can be reduced because the wider portion of the metal interconnect approaches the semiconductor substrate, but the parasitic capacitance increases. In the latter, the parasitic capacitance reduces, but the resistance increases. There are advantages and disadvantages.

For this reason, when the operating frequency of the circuit, which uses these spiral inductors or transformers, is lower, the former is selected, and when the operating frequency is higher, the latter is selected. This enables the influence of the parasitic component, which is larger depending on the operating frequency, to be reduced.

INDUSTRIAL APPLICABILITY

As mentioned above, the spiral inductor according to the present invention is adapted to perform a high-performance and small-sized spiral inductor with controlling the electromigration.

The invention claimed is:

1. A spiral inductor comprising:
   n levels ($n \geq 2$) of electrically conductive films;
   insulators inserted between pairs of the levels of the electrically conductive films;
   a continuous spiral interconnect having a spiral shape and including continuous spiral turns, an internal end located inside the spiral shape, and an external end located outside the spiral shape, the spiral interconnect being disposed entirely in an i-th layer ($2 \leq i \leq n$) of the electrically conductive films, and being electrically connected by contact plugs to an electrically conductive film in a layer adjacent to the i-th layer;
   a first underpass interconnect, including a k-th layer ($1 \leq k \leq n-1$) of the electrically conductive films, that is electrically connected to an electrically conductive film in a layer adjacent to the k-th layer, and that is electrically connected through contact plugs to the internal end of the spiral interconnect, where the spiral interconnect and the first underpass interconnect are opposite each other, wherein,
   j ($1 \leq j < i$) layers of the electrically conductive films are part of the first underpass interconnect, and
   at least one of the turns of the spiral interconnect where opposite the first underpass interconnect is wider than parts of the turns of the spiral interconnect that are not directly opposite the first underpass interconnect; and
   a second underpass interconnect including h levels ($1 \leq h \leq n-1$) of electrically conductive films electrically connected by contact plugs to an electrically conductive film in an adjacent layer, and electrically connected to the spiral interconnect between the internal and external ends, but not to the internal and external ends of the spiral interconnect, where the spiral interconnect and the second underpass interconnect are opposite each other, wherein
   m layers ($1 \leq m < i$) of the electrically conductive films adjacent to each other are part of the second underpass interconnect, and
   at least one of the turns of the spiral interconnect where opposite the second underpass interconnect is wider than parts of the turns of the spiral interconnect that are not directly opposite the first and second underpass interconnects.

2. A transformer that is a combination of the two spiral inductors, each of which is described in claim 1.

* * * * *